United States Patent
Shih et al.

(10) Patent No.: US 8,698,307 B2
(45) Date of Patent: Apr. 15, 2014

(54) SEMICONDUCTOR PACKAGE WITH INTEGRATED METAL PILLARS AND MANUFACTURING METHODS THEREOF

(75) Inventors: Meng-Kai Shih, Kaohsiung (TW); Chang-Chi Lee, Kaohsiung (TW)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 9 days.

(21) Appl. No.: 13/084,879

(22) Filed: Apr. 12, 2011

(65) Prior Publication Data

US 2012/0074532 A1   Mar. 29, 2012

(30) Foreign Application Priority Data

Sep. 27, 2010 (TW) .................. 99132517 A

(51) Int. Cl.
*H01L 23/48* (2006.01)
(52) U.S. Cl.
USPC .......................................... 257/737; 257/629
(58) Field of Classification Search
USPC .......... 257/516, E29.325, 629, 737, 773, 775, 257/E23.141, E23.002, E23.01
See application file for complete search history.

(56) References Cited

U.S. PATENT DOCUMENTS

| | | | |
|---|---|---|---|
| 3,761,309 A | 9/1973 | Schmitter et al. |
| 4,341,594 A | 7/1982 | Carlson et al. |
| 4,845,542 A | 7/1989 | Bezuk et al. |
| 5,466,635 A | 11/1995 | Lynch et al. |
| 5,629,564 A | 5/1997 | Nye, III et al. |
| 5,640,052 A | 6/1997 | Tsukamoto |
| 5,656,858 A | 8/1997 | Kondo et al. |
| 5,698,465 A | 12/1997 | Lynch et al. |
| 5,790,377 A | 8/1998 | Schreiber et al. |
| 5,872,404 A | 2/1999 | Lynch et al. |
| 5,914,536 A | 6/1999 | Shizuki et al. |

(Continued)

FOREIGN PATENT DOCUMENTS

| | | |
|---|---|---|
| CN | 1391278 | 1/2003 |
| CN | 1835218 | 9/2006 |

(Continued)

OTHER PUBLICATIONS

JSR Micro Materials Innovation, JSR LKD-5109, Low k challenges beyond 100 nm, pp. 1-33, (Oct. 16, 2002).

(Continued)

*Primary Examiner* — Tran Tran
(74) *Attorney, Agent, or Firm* — Foley & Lardner LLP; Cliff Z. Liu; Angela D. Murch

(57) ABSTRACT

A semiconductor package includes a substrate and a semiconductor device. The semiconductor device includes a body having a center, a layer disposed adjacent to the body, and a plurality of conductive pillars configured to electrically connect the semiconductor device to the substrate. The layer defines a plurality of openings. Each of the plurality of conductive pillars extends at least partially through a corresponding one of the plurality of openings. An offset between a first central axis of the each of the plurality of conductive pillars and a second central axis of the corresponding one of the plurality of openings varies with distance between the first central axis and the center of the body. The second central axis of the corresponding one of the plurality of openings is disposed between the first central axis of the each of the plurality of conductive pillars and the center of the body.

20 Claims, 6 Drawing Sheets

(56) References Cited

U.S. PATENT DOCUMENTS

| | | |
|---|---|---|
| 5,943,597 A | 8/1999 | Kleffner et al. |
| 6,013,571 A | 1/2000 | Morrell |
| 6,028,357 A | 2/2000 | Moriyama |
| 6,051,450 A | 4/2000 | Oshawa et al. |
| 6,077,765 A | 6/2000 | Naya |
| 6,107,164 A | 8/2000 | Ohuchi |
| 6,159,837 A | 12/2000 | Yamaji et al. |
| 6,229,220 B1 | 5/2001 | Saitoh et al. |
| 6,281,106 B1 | 8/2001 | Higdon et al. |
| 6,350,705 B1 | 2/2002 | Lin |
| 6,362,087 B1 | 3/2002 | Wang et al. |
| 6,362,090 B1 | 3/2002 | Paik et al. |
| 6,378,759 B1 | 4/2002 | Ho et al. |
| 6,501,185 B1 | 12/2002 | Chow et al. |
| 6,510,976 B2 | 1/2003 | Hwee et al. |
| 6,550,666 B2 | 4/2003 | Chew et al. |
| 6,573,598 B2 | 6/2003 | Ohuchi et al. |
| 6,578,754 B1 | 6/2003 | Tung |
| 6,592,019 B2 | 7/2003 | Tung |
| 6,599,775 B2 | 7/2003 | Tie et al. |
| 6,600,234 B2 | 7/2003 | Kuwabara et al. |
| 6,639,299 B2 | 10/2003 | Aoki |
| 6,642,136 B1 | 11/2003 | Lee et al. |
| 6,664,128 B2 | 12/2003 | Tong et al. |
| 6,677,674 B2 * | 1/2004 | Nagao ............................ 257/724 |
| 6,681,982 B2 | 1/2004 | Tung |
| 6,683,375 B2 | 1/2004 | Joshi et al. |
| 6,731,003 B2 | 5/2004 | Joshi et al. |
| 6,732,913 B2 | 5/2004 | Alvarez |
| 6,734,039 B2 | 5/2004 | Hwee et al. |
| 6,740,577 B2 | 5/2004 | Jin et al. |
| 6,750,082 B2 | 6/2004 | Briar et al. |
| 6,756,671 B2 | 6/2004 | Lee et al. |
| 6,784,087 B2 | 8/2004 | Lee et al. |
| 6,818,545 B2 | 11/2004 | Lee et al. |
| 6,888,209 B2 | 5/2005 | Jobetto |
| 6,917,119 B2 | 7/2005 | Lee et al. |
| 6,929,981 B2 | 8/2005 | Hwee et al. |
| 6,940,168 B2 | 9/2005 | Garrity et al. |
| 7,008,867 B2 | 3/2006 | Lei |
| 7,022,548 B2 | 4/2006 | Joshi et al. |
| 7,071,573 B1 | 7/2006 | Lin |
| 7,087,458 B2 | 8/2006 | Wang et al. |
| 7,122,403 B2 | 10/2006 | Chandran et al. |
| 7,122,897 B2 * | 10/2006 | Aiba et al. ...................... 257/738 |
| 7,135,770 B2 | 11/2006 | Nishiyama et al. |
| 7,268,438 B2 | 9/2007 | Nishiyama et al. |
| 7,276,801 B2 | 10/2007 | Dubin et al. |
| 7,361,990 B2 | 4/2008 | Lu et al. |
| 7,391,112 B2 | 6/2008 | Li et al. |
| 7,449,406 B2 | 11/2008 | Nishiyama et al. |
| 7,456,496 B2 | 11/2008 | Hwee et al. |
| 7,476,564 B2 | 1/2009 | Chen et al. |
| 7,550,375 B2 | 6/2009 | Wang et al. |
| 7,579,694 B2 | 8/2009 | Jan |
| 7,750,469 B2 | 7/2010 | Cho et al. |
| 8,552,553 B2 | 10/2013 | Lo et al. |
| 2002/0011664 A1 | 1/2002 | Tanaka |
| 2003/0127734 A1 | 7/2003 | Lee et al. |
| 2003/0129822 A1 | 7/2003 | Lee et al. |
| 2003/0219966 A1 | 11/2003 | Jin et al. |
| 2004/0087057 A1 | 5/2004 | Wang et al. |
| 2006/0006544 A1 | 1/2006 | Farrar |
| 2007/0004086 A1 | 1/2007 | Hua et al. |
| 2007/0075423 A1 | 4/2007 | Ke et al. |
| 2007/0249093 A1 | 10/2007 | Aiba et al. |
| 2008/0088019 A1 | 4/2008 | Lin |
| 2008/0150161 A1 | 6/2008 | Lin et al. |
| 2008/0296761 A1 | 12/2008 | Lee et al. |
| 2008/0308934 A1 | 12/2008 | Alvarado |
| 2009/0072385 A1 | 3/2009 | Alley et al. |
| 2009/0096092 A1 | 4/2009 | Patel |
| 2009/0155955 A1 | 6/2009 | Liang |
| 2009/0289360 A1 | 11/2009 | Takahashi et al. |
| 2010/0055846 A1 * | 3/2010 | Lii et al. ........................ 438/124 |
| 2010/0105173 A1 * | 4/2010 | Fujimori ........................ 438/121 |
| 2010/0155924 A1 | 6/2010 | Knapp et al. |
| 2010/0155946 A1 | 6/2010 | Lee |
| 2010/0244024 A1 | 9/2010 | Do et al. |
| 2011/0084381 A1 | 4/2011 | Lo et al. |
| 2011/0084389 A1 | 4/2011 | Lo et al. |

FOREIGN PATENT DOCUMENTS

| | | |
|---|---|---|
| CN | 1866504 | 11/2006 |
| JP | 54128669 | 10/1979 |
| JP | 60217646 | 10/1985 |
| JP | 62160744 | 7/1987 |
| JP | 1123440 | 5/1989 |
| JP | 4144143 | 5/1992 |
| JP | 5109820 | 4/1993 |
| JP | 5152376 | 6/1993 |
| JP | 5315339 | 11/1993 |
| JP | 7211722 | 8/1995 |
| JP | 7335648 | 12/1995 |
| JP | 8008259 | 1/1996 |
| JP | 8013166 | 1/1996 |
| JP | 9266230 | 10/1997 |
| JP | 9045691 | 12/1997 |
| JP | 2000091371 | 3/2000 |
| JP | 2000269387 | 9/2000 |
| JP | 2002043352 | 2/2002 |
| JP | 2006279062 | 10/2006 |
| JP | 2008047667 | 2/2008 |

OTHER PUBLICATIONS

Proceedings of the IEEE 2002 International Interconnect Technology Conference, Digest of Technical Papers, Jun. 3-5, 2002.

Rasco, et al., "Packaging, assessment of Porous Ultra low-K materials", IEEE, pp. 113-115, (2002).

* cited by examiner

SEMICONDUCTOR PACKAGE WITH INTEGRATED METAL PILLARS AND MANUFACTURING METHODS THEREOF

CROSS-REFERENCE TO RELATED APPLICATION

This application claims the benefit of Taiwan Patent Application No. 099132517, filed on Sep. 27, 2010, the subject matter of which is incorporated herein by reference.

BACKGROUND OF THE INVENTION

1. Field of the Invention

The present invention relates generally to semiconductor packages and manufacturing methods thereof. More particularly, the invention relates to semiconductor packages with integrated metal pillars and manufacturing methods thereof.

2. Description of Related Art

A conventional flip chip package typically includes a substrate, conductive solder, a chip, and an underfill material. The substrate can be an organic substrate having an upper surface, at least one substrate pad, and a solder mask layer. The solder mask layer can have an opening so as to expose part of the substrate pad. The chip typically includes a chip body, a chip pad, a passivation layer, and at least one under ball metal layer. The conductive solder can be disposed between the substrate pad and the under ball metal layer to form electrical and mechanical connections. The underfill material can be filled into the space between the substrate and the die to protect the solder connections.

Typically, the chip has metal layers and interlayer dielectric layers formed adjacent to the silicon chip body. As the width of wires on the chip narrows and as the density of the circuit increases, the dielectric constant (k) of the dielectric layer can be reduced, so as to reduce the effects of leakage current of the circuit, capacitance effects between wires, and heat produced by the circuit. Dielectric layers can be classified as: standard k (4.5<k<10), low k (k<3.0), ultra low k (2.0<k<2.5), and extremely low k (k<2.0). A dielectric layer having ultra low k or extremely low k can be used in a 45 nanometer process. A typical method of forming an ultra low k and extremely low k dielectric layer is to make the dielectric layer porous with voids dispersed randomly within a contiguous solid dielectric.

However, in a conventional structure including conductive solder, a pitch corresponding to a certain distance is maintained between substrate pads and between chip pads, to prevent the conventional structure from becoming a short circuit during a reflow process of the conductive solder. This can limit the extent to which a package having the conventional structure can be miniaturized.

Furthermore, the strength of the dielectric layer decreases as the dielectric constant (k) decreases. The ultra low k and extremely low k dielectric layers tend to have low tensile strength, which can result in cracking at lower values of tensile stress than for higher k dielectric layers.

It is against this background that a need arose to develop the semiconductor package and related methods described herein.

SUMMARY OF THE INVENTION

One aspect of the invention relates to a semiconductor package. In one embodiment, the semiconductor package includes a substrate and a semiconductor device. The semiconductor device comprises: (1) a body having a center; (2) a first layer disposed adjacent to the body, wherein the first layer defines a plurality of openings; and (3) a plurality of conductive pillars configured to electrically connect the semiconductor device to the substrate, each of the plurality of conductive pillars extending at least partially through a corresponding one of the plurality of openings. An offset between a first central axis of the each of the plurality of conductive pillars and a second central axis of the corresponding one of the plurality of openings varies with distance between the first central axis and the center of the body. The second central axis of the corresponding one of the plurality of openings is disposed between the first central axis of the each of the plurality of conductive pillars and the center of the body.

In another embodiment, the semiconductor package includes a substrate and a semiconductor device. The semiconductor device comprises: (1) a body; (2) a pad disposed adjacent to the body; (3) a first layer disposed adjacent to the body, wherein the first layer defines an opening having a first diameter and exposing the pad; and (4) a conductive interconnect electrically connected to the pad and extending at least partially into the opening, wherein the conductive interconnect has a second diameter, and the second diameter is at least twice as large as the first diameter.

In another embodiment, the semiconductor package includes a substrate and a semiconductor device. The semiconductor device comprises: (1) a body; (2) a dielectric layer disposed adjacent to the body, wherein the dielectric layer is subject to stress resulting from a mismatch of coefficient of thermal expansion (CTE) between the substrate and the semiconductor device; and (3) means for reducing a maximum stress on the dielectric layer to protect the dielectric layer from at least one of cracking and delamination.

Other aspects and embodiments of the invention are also contemplated. The foregoing summary and the following detailed description are not meant to restrict the invention to any particular embodiment but are merely meant to describe some embodiments of the invention.

Figure 1:
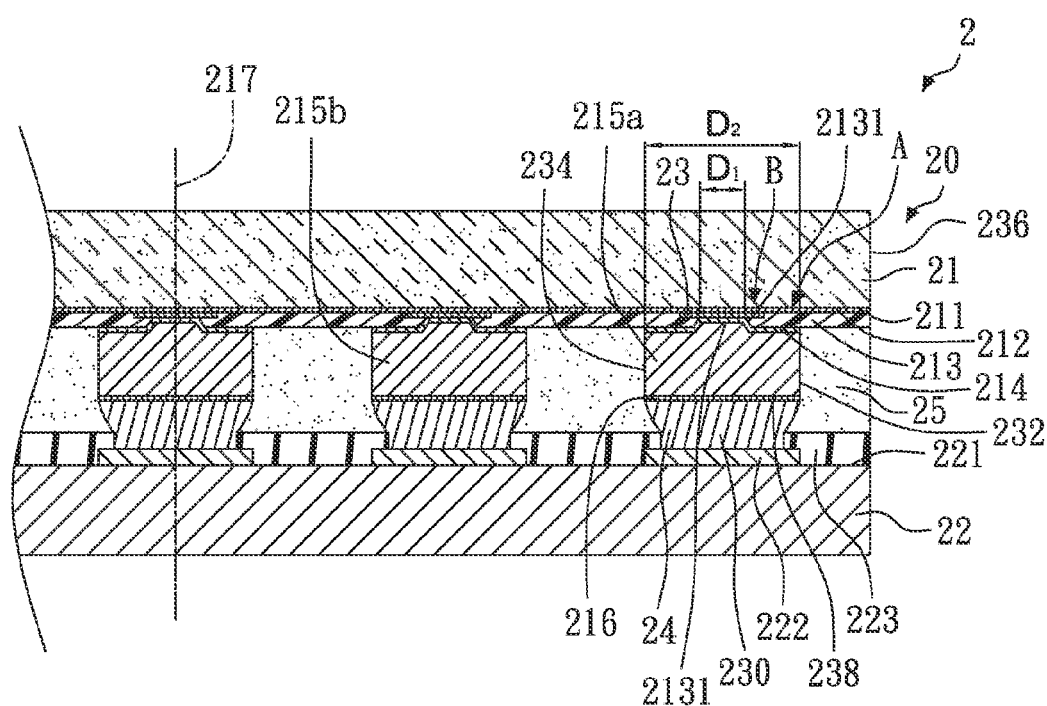
FIG. 1 illustrates a cross section view of a semiconductor package, according to an embodiment of the invention.

The drawings illustrate embodiments of the invention and, together with the description, serve to explain the principles of some embodiments of the invention. Reference will now be made in detail to some embodiments of the invention, examples of which are illustrated in the accompanying drawings. Wherever possible, the same reference numbers are used in the drawings and the descriptions to refer to the same or like features.

DETAILED DESCRIPTION OF THE INVENTION

Referring to FIG. 1, a cross section view of a semiconductor package 2 according to an embodiment of the invention is illustrated. The package 2 includes a substrate 22, at least one electrical connector 24 (for example, conductive solder), a semiconductor device 20, and an underfill layer 25. In the illustrated embodiment, the semiconductor device 20 is a semiconductor chip, although it is contemplated that the semiconductor device 20, in general, can be any active device such as an active electronic component, any passive device, or a combination thereof. The semiconductor device 20 may be disposed adjacent to the electrical connector 24. The semiconductor device 20 may be bonded to the electrical connector 24 by flip chip bonding. The substrate 22 includes an upper surface 221, at least one substrate pad 222, and a solder mask layer 223. The substrate 22 may be an organic substrate. In one embodiment, the solder mask layer 223 is disposed adjacent to the upper surface 221, and defines an opening 230 that exposes part of the substrate pad 222. The substrate pad 222 and the electrical connector 24 may be disposed adjacent to the upper surface 221 of the substrate 22, and the electrical connector 24 may be disposed on the substrate pad 222. In one embodiment, the substrate pad 222 may be disposed between the electrical connector 24 and the upper surface 221 of the substrate 22.

In one embodiment, the semiconductor device 20 includes a body 21, a pad 23, at least one dielectric layer 212, a passivation layer 213, at least one metal layer 214, at least one metal pillar 215 (conductive interconnect 215), and at least one barrier layer 216. The dielectric layer 212 may be disposed between the body 21 and the passivation layer 213. The passivation layer 213 may define at least one opening 2131 that exposes the pad 23. The metal layer 214 may extend into the opening 2131 to electrically connect the metal pillar 215 to the pad 23. The opening 2131 has a first diameter $D_1$. In one embodiment, the metal layer 214 may be an under ball metal layer. The metal pillar 215 may be disposed between the metal layer 214 and the barrier layer 216. The electrical connector 24 may extend into the opening 230 to electrically connect the substrate pad 22 to the at least one barrier layer 216.

The body 21 has a surface 211. In one embodiment, the body 21 is formed from silicon. The dielectric layer 212 may be disposed adjacent to the surface 211 of the body 21. In one embodiment, the dielectric layer 212 is porous with voids dispersed randomly in its structure. Alternatively, the dielectric layer 212 can be porous and include voids engineered in its structure. The dielectric layer 212 may have micro-structures with nanoscale cavities. In one embodiment, the dielectric layer 212 has ultra low k or extremely low k. The dielectric constant of the dielectric layer 212 may be less than about 2.5, such as in the range from about 2.0 to about 2.5, from about 1.5 to about 2.0, from about 1.5 to about 2.5, and from about 1.7 to about 2.5.

The material of the passivation layer 213 can be polyimide or another insulating material. The passivation layer 213 may be disposed adjacent to the dielectric layer 212.

In one embodiment, the metal layer 214 is disposed at least partially in the opening 2131 and covers part of the passivation layer 213. The metal layer 214 may be formed from titanium/copper (Ti/Cu), nickel/gold (Ni/Au), or other suitable metals, alloys, or sequences of metals and/or alloys, such as, but not limited to Cr/Cr—Cu/Cu, Ti/Ni—V, Ti/Ni—V/Cu, Ti/W, or Ti/W/Au. In one embodiment, the metal pillar 215 may be disposed adjacent to the metal layer 214, and may extend partially into the corresponding opening 2131. Alternatively, if the semiconductor device 20 does not include the metal layer 214, the metal pillar 215 is disposed in the opening 2131 and covers part of the passivation layer 213. In one embodiment, the metal pillar 215 has a second diameter $D_2$.

The metal pillar 215 may be formed from at least one of copper and its alloys, gold and its alloys, and silver and its alloys.

In one embodiment, the barrier layer 216 is formed from nickel or chromium. The barrier layer 216 is disposed on a surface 238 of the metal pillar 215 and is electrically connected to the electrical connector 24. The electrical connector may be formed from a solder material. The melting point of the electrical connector 24 can be lower than that of the metal pillar 215. The barrier layer 216 can prevent the electrical connector 24 from melting onto the surface of the metal pillar 215. In one embodiment, the underfill layer 25 is disposed between the upper surface 221 of the substrate 22 and the surface 211 of the body 21, and encapsulates and protects the electrical connector 24 and the metal pillar 215.

Because the dielectric layer 212 having voids in its structure can be weak in tensile strength, it is desirable to understand the stress distribution within the semiconductor package 2, and to determine locations in the semiconductor package 2 where the stress is concentrated (stress concentration). Since the coefficient of thermal expansion (CTE) of the substrate 22 is larger than the CTE of the semiconductor device 20, after a reflow process or a thermal cycling process, the substrate 22 contracts more than the semiconductor device 20. The difference in the contraction of the semiconductor device 20 relative to the substrate 22 can cause tensile stress (outward from the surface of the semiconductor device 20) on the metal pillars 215. The tensile stress can be larger on an outer surface 232 of the metal pillar 215 than on an inner surface 234 of the metal pillar 215. The outer surface 232 of the metal pillar 215 is on an opposite side of the metal pillar 215 from a central axis 217 of the body 21, and the inner surface 234 of the metal pillar 215 is on the same side of the metal pillar 215 as the central axis 217. The tensile stress of the metal pillars 215 can increase with the distance between the metal pillar 215 and the central axis 217 of the body 21. For example, a metal pillar 215a nearest a lateral surface 236 of the semiconductor package 2 (and therefore farther from the central axis 217 than other metal pillars such as a metal pillar 215b) may have an average tensile stress and a peak tensile stress that are larger than the corresponding stress values of the metal pillar 215b. The lateral surface 236 may be proximate to the metal pillar 215a and the metal pillar 215b, such that the metal pillar 215a is between the metal pillar 215b and the lateral surface 236.

Figure 2A:
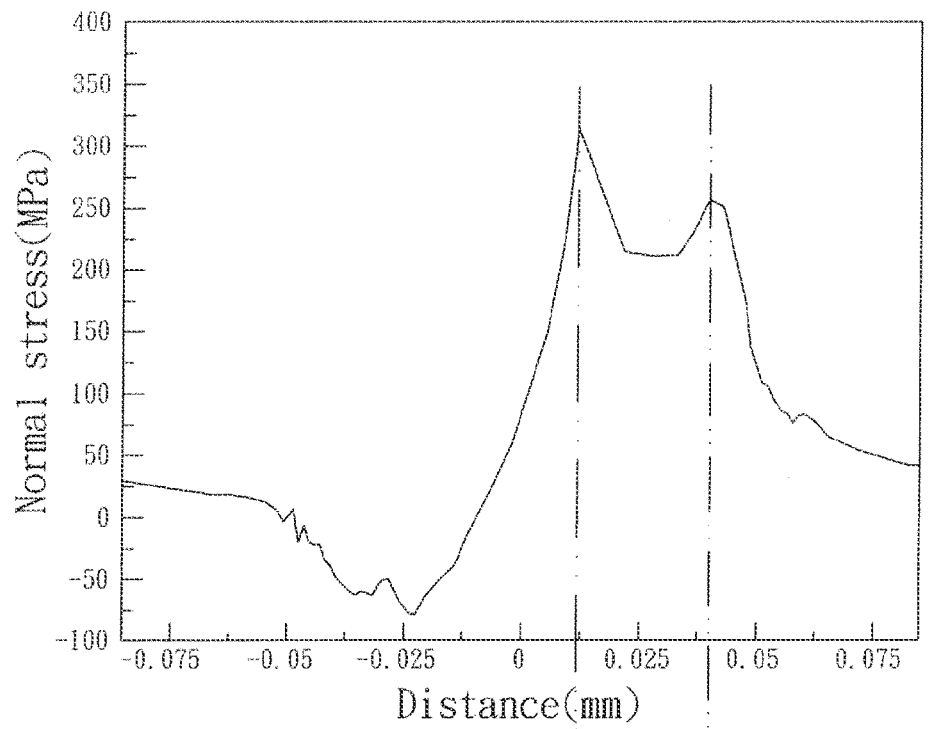
FIG. 2A illustrates a stress distribution of a metal pillar of FIG. 1, according to an embodiment of the invention.
Figure 2B:
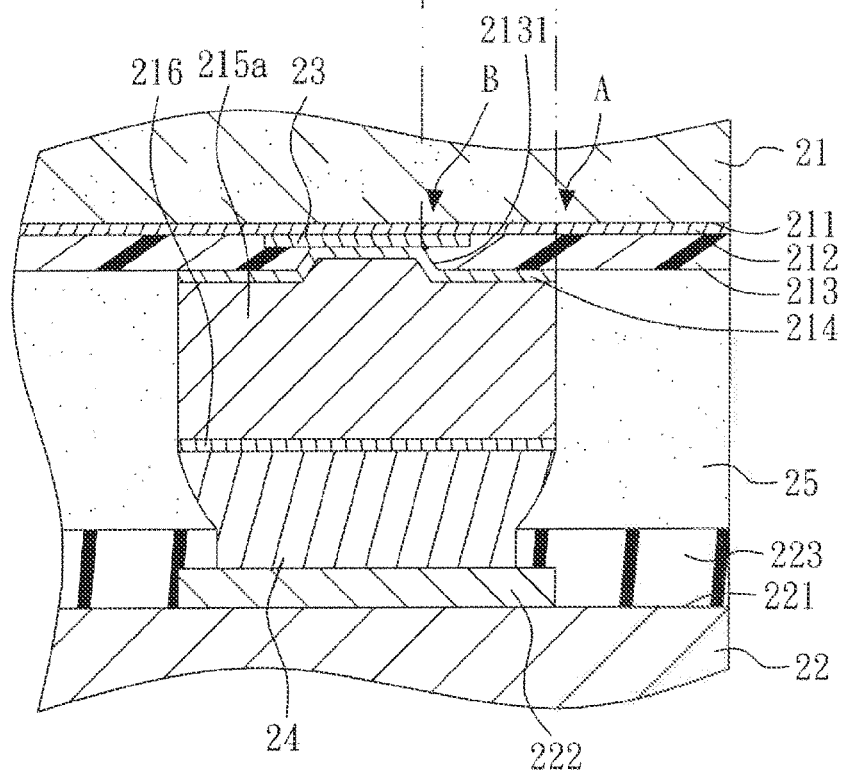
FIG. 2B illustrates an enlarged cross section view of the metal pillar of FIG. 1, according to an embodiment of the invention.

Referring to FIGS. 2A and 2B and taking the metal pillar 215a as an example, since area A and area B of the semiconductor package 2 are sharp corners that cause stress concentrations, there can be a peak value of the tensile stress distribution in each of these two areas. If the distance between the area A and the area B is too close, the two peak values of the tensile stress can superimpose to form a greater maximum value. This greater maximum value can exceed the tensile strength of the dielectric layer 212, and can result in cracking of the dielectric layer 212 or delamination thereof.

Figure 3:
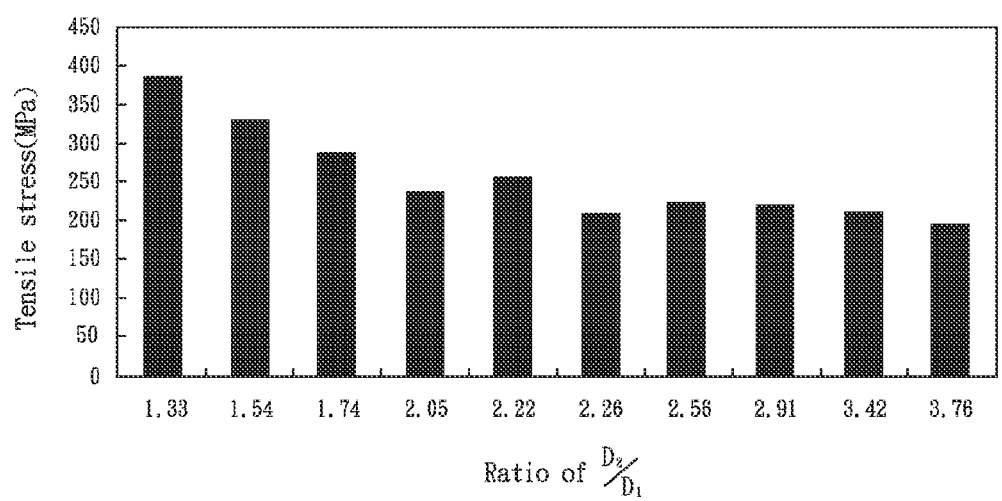
FIG. 3 illustrates a simulation result of the maximum value of tensile stress on the metal pillar of FIG. 1, according to an embodiment of the invention.

Referring to FIG. 3, based on simulation, the maximum value of the tensile stress on the metal pillar 215 can significantly decrease when the ratio of the second diameter to the first diameter ($D_2/D_1$) is greater than or equal to a value of about 2. Therefore, when the second diameter $D_2$ is at least twice as large as the first diameter $D_1$, the maximum value of the tensile stress sustained by the dielectric layer 212 can be reduced by about 40% or more, which can protect the dielectric layer 212 from cracking or delamination.

Figure 4:
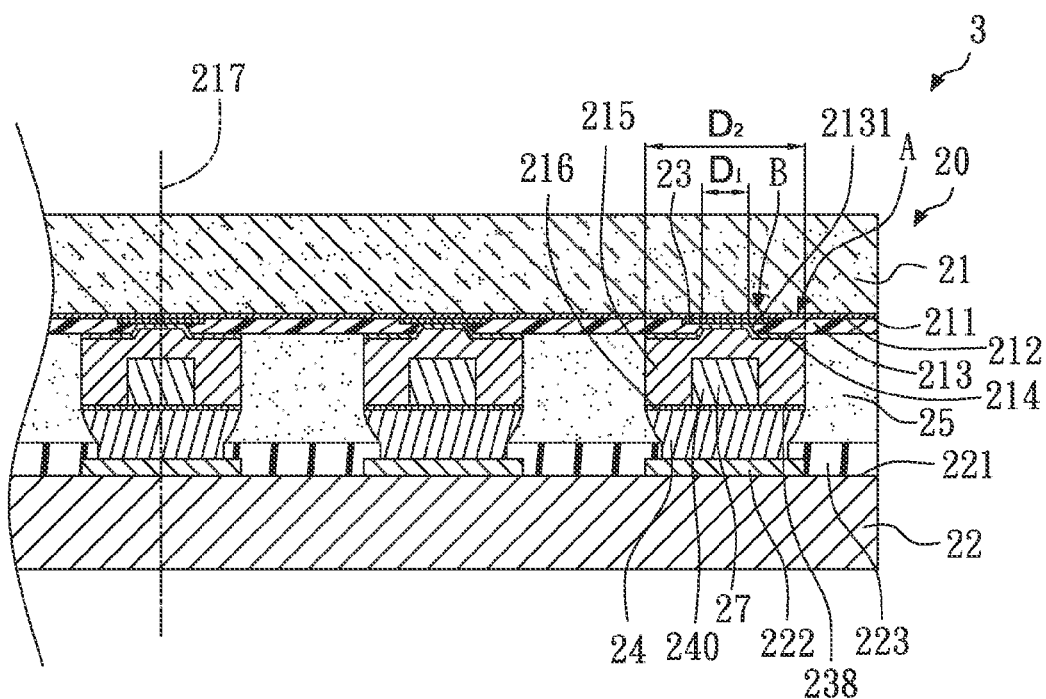
FIG. 4 illustrates a cross section view of a semiconductor package, according to an embodiment of the invention.

Referring to FIG. 4, a cross section view of a semiconductor package 3 according to an embodiment of the invention is illustrated. The package 3 according to this embodiment is similar to the package 2 described with reference to FIG. 1, and the same elements are designated by the same reference numbers. The difference between the package 3 and the package 2 is that, in the embodiment of FIG. 4, the semiconductor device 20 further includes a metal layer 27 disposed in an opening 240 (a cavity 240) defined by the metal pillar 215. The cavity 240 may be formed adjacent to the surface 238 of the metal pillar 215, and the metal layer 27 may then be formed in the cavity 240. The cavity 240 may be aligned with the opening 2131. In one embodiment, the metal layer 27 may be formed from solder, or from another metallic material softer than the metal pillar 215. If the metal layer 27 is softer than the metal pillar 215, the deformation of the metal layer 27 can release the stress caused by the CTE mismatch between the substrate 22 and the semiconductor device 20. As a result, the maximum value of the tensile stress can be reduced. In one embodiment, the barrier layer 216 may be disposed adjacent to the cavity 240.

Figure 5:
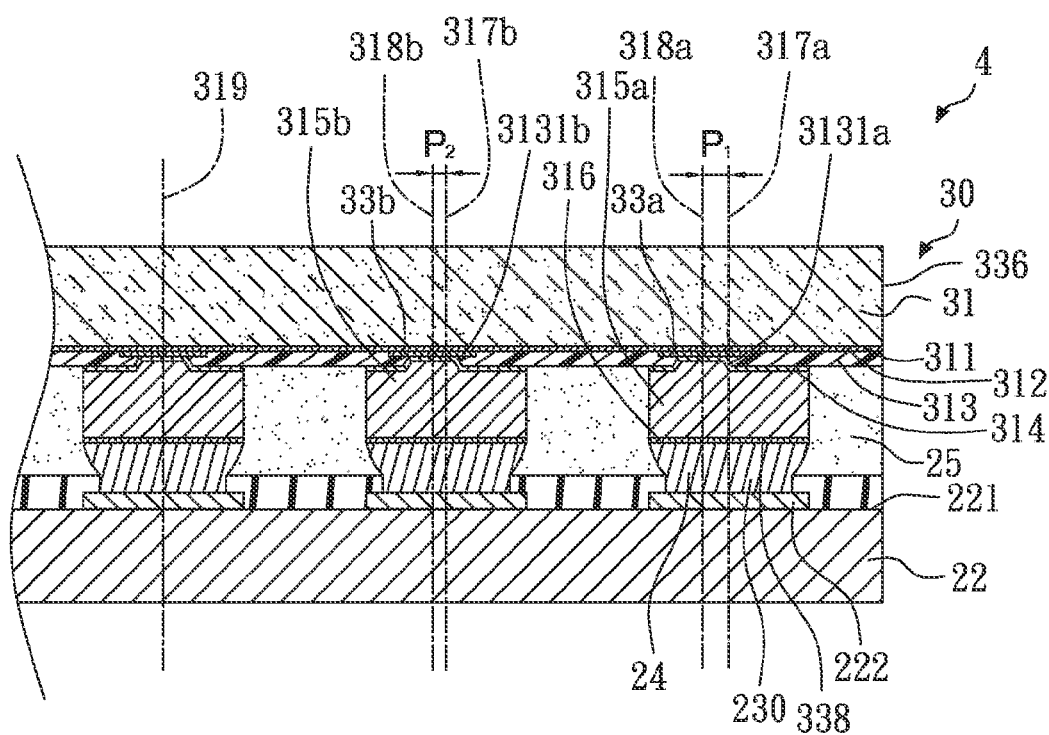
FIG. 5 illustrates a cross section view of a semiconductor package, according to an embodiment of the invention.

Referring to FIG. 5, a cross section view of a semiconductor package 4 according to an embodiment of the invention is illustrated. The package 4 according to this embodiment is similar to the package 2 described with reference to FIG. 1, and the same elements are designated by the same reference numbers. The package 4 includes the substrate 22, the at least one electrical connector 24 (for example, conductive solder), a semiconductor device 30, and the underfill layer 25. In the illustrated embodiment, the semiconductor device 30 is a semiconductor chip, although it is contemplated that the semiconductor device 30, in general, can be any active device such as an active electronic component, any passive device, or a combination thereof. The semiconductor device 30 may be disposed adjacent to the electrical connector 24. The semiconductor device 30 may be bonded to the electrical connector 24 by flip chip bonding.

In one embodiment, the semiconductor device 30 includes a body 31, a plurality of pads 33 (such as first pad 33a and second pad 33b), at least one dielectric layer 312, a passivation layer 313, at least one metal layer 314, a plurality of metal pillars 315 (conductive interconnects 315) and a barrier layer 316. The dielectric layer 312 may be disposed between the body 31 and the passivation layer 313. The passivation layer 313 may define at least one opening 3131 (such as first opening 3131a and second opening 3131b) that exposes the pads 33 (such as first chip pad 33a and second chip pad 33b). The metal layer 314 may extend into the openings 3131 to electrically connect the metal pillars 315 (such as first metal pillar 315a and second metal pillar 315b) to the corresponding pads 33. In one embodiment, the metal layer 314 may be an under ball metal layer. The metal pillars 315 may be disposed between the metal layer 314 and the barrier layer 316. The electrical connector 24 may extend into the opening 230 to electrically connect the substrate pad 22 to the barrier layer 316.

The body 31 has a surface 311. In one embodiment, the body 31 is formed from silicon. The dielectric layer 312 may be disposed adjacent to the surface 311 of the body 31. In one embodiment, the dielectric layer 312 is porous with voids dispersed randomly in its structure. Alternatively, the dielectric layer 312 can be porous and include voids engineered in its structure. The dielectric layer 312 may have micro-structures with nanoscale cavities. In one embodiment, the dielectric constant of the dielectric layer 312 may be less than about 2.5, such as in the range from about 2.0 to about 2.5, from about 1.5 to about 2.0, from about 1.5 to about 2.5, and from about 1.7 to about 2.5.

The material of the passivation layer 313 can be polyimide or another insulating material. The passivation layer 313 may be disposed adjacent to the dielectric layer 312.

In one embodiment, the metal layer 314 is disposed at least partially in the openings 3131 (such as first opening 3131a and second opening 3131b) and cover part of the passivation layer 313. The metal layer 314 may be formed from titanium/copper (Ti/Cu), nickel/gold (Ni/Au), or other suitable metals, alloys, or sequences of metals and/or alloys, such as, but not limited to Cr/Cr—Cu/Cu, Ti/Ni—V, Ti/Ni—V/Cu, Ti/W, or Ti/W/Au. In one embodiment, the metal pillars 315 may be disposed adjacent to the metal layer 314, and may extend partially into the corresponding openings 3131. Alternatively, if the semiconductor device 30 does not include the metal layer 314, the metal pillars 315 are disposed in the openings 3131 and cover part of the passivation layer 313. The metal pillars may be formed from at least one of copper and its alloys, gold and its alloys, and silver and its alloys.

In one embodiment, the barrier layer 316 is formed from nickel or chromium. The barrier layer 316 is disposed on a surface 338 of each of the metal pillars 315 and is electrically connected to the electrical connector 24. The barrier layer 316 can prevent the electrical connector 24 from melting onto the surface of the metal pillars 315.

In one embodiment, the metal pillars (such as first metal pillar 315a and second metal pillar 315b) are disposed adjacent to the metal layer 314, and may extend partially into the corresponding openings 3131 (such as first opening 3131a and second opening 3131b). There may be an offset between a central axis 317 of each of the metal pillars 315 and a central axis 318 of each corresponding opening 3131. In this embodiment, the central axis 318 of each opening 3131 is disposed between the central axis 317 of each corresponding metal pillar 315 and a center 319 of the chip body 31. The center 319 may correspond to a central axis of the chip body 31. For example, the first metal pillar 315a corresponds to the first opening 3131a, and the second metal pillar 315b corresponds to the second opening 3131b. A first offset $P_1$ is defined as the distance between the central axis 317a of the first metal pillar 315a and the central axis 318a of the first opening 3131a. A second offset $P_2$ is defined as the distance between the central axis 317b of the second metal pillar 315b and the central axis 318b of the second opening 3131b.

In the package 4, because of the effect of each of the first offset $P_1$ and the second offset $P_2$, the distance between the area A and the area B (shown in FIG. 2B) is increased for each of the metal pillars 315a and 315b, respectively. Accordingly, the two peak values of the tensile stress for each of the metal pillars 315 (such as the first metal pillar 315a and the second metal pillar 315b) do not superimpose or superimpose only slightly, so as to reduce the maximum value of the tensile stress on each of the metal pillars 315. Based on simulation, the maximum value of the tensile stress sustained by the dielectric layer 312 can be significantly reduced due to the offset described above. For example, when the diameter of the first opening 3131a is 25 μm and the diameter of the first metal pillar 315a is 120 μm, the maximum value of the tensile stress sustained by the dielectric layer 312 can be reduced by more than 8% when the offset $P_1$ is 20 μm. This can protect the dielectric layer 312 from cracking or delamination.

In one embodiment, the distance between the first metal pillar 315a and the center 319 is greater than the distance between the second metal pillar 315b and the center 319. Since the tensile stress of the metal pillars 315 increases with the distance between the central axis 317 of the metal pillar 315 and the center 319 of the chip body 31, it is preferable to make the first offset $P_1$ greater than or equal to the second offset $P_2$, because the first metal pillar 315a sustains more stress than the second metal pillar 315b.

In one embodiment, the package 4 has a lateral surface 336 proximate to the first metal pillar 315a, and a distal lateral surface (not shown) opposite to the lateral surface 336. The distance between the first metal pillar 315a and the lateral surface 336 proximate to the first metal pillar 315a is less than the distance between the first metal pillar 315a and the distal lateral surface. The distance between the first metal pillar 315a and the lateral surface 336 is less than the distance between the second metal pillar 315b and the lateral surface 336. Since the tensile stress of the metal pillars 315 decreases as the distance between the central axis 317 of the metal pillar 315 and the lateral surface 336 proximate to the metal pillar 315 increases, it is preferable to make the first offset $P_1$ greater than or equal to the second offset $P_2$, because the first metal pillar 315a sustains more stress than the second metal pillar 315b.

In one embodiment, each of the first opening 3131a and the second opening 3131b has a first diameter, each of the first metal pillar 315a and the second metal pillar 315b has a second diameter. As described with reference to FIG. 3, the maximum value of the tensile stress on the metal pillars 315 can be significantly reduced when the ratio of the second diameter to the first diameter is greater than or equal to a value of about 2, which can protect the dielectric layer 312 from cracking or delamination.

Figure 6:
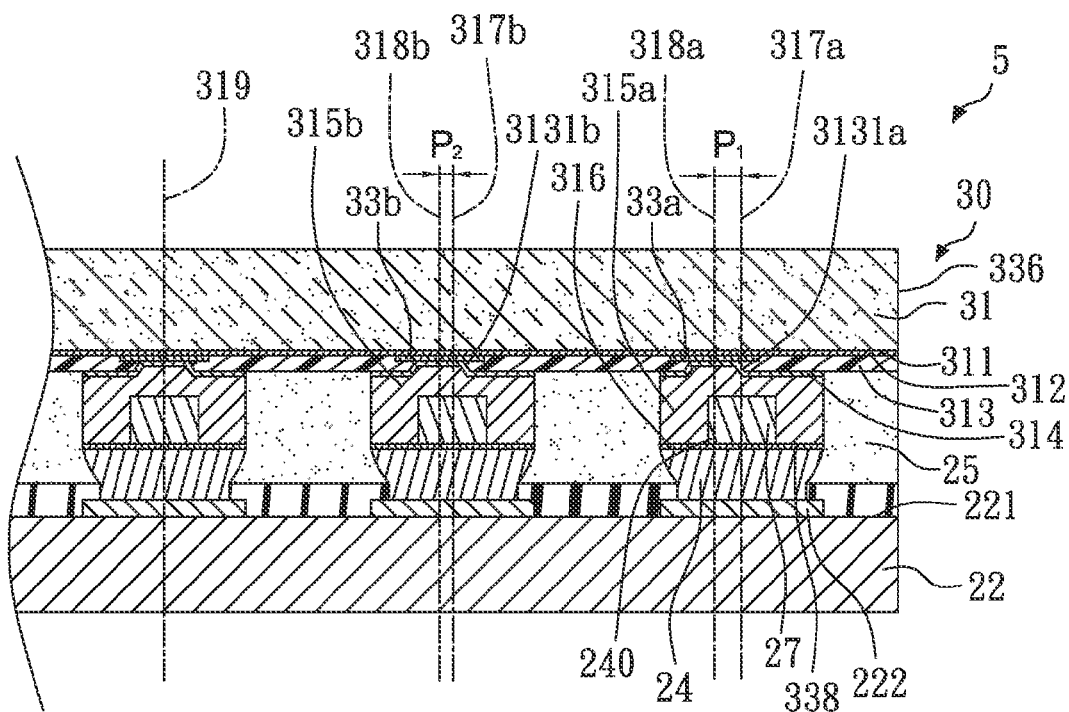
FIG. 6 illustrates a cross section view of a semiconductor package, according to an embodiment of the invention.

Referring to FIG. 6, a cross section view of a semiconductor package 5 according to an embodiment of the present invention is illustrated. The package 5 according to this embodiment is similar to the package 4 of FIG. 5, and the same elements are designated by the same reference numbers. The difference between the package 5 and the package 4 is that, in the embodiment of FIG. 5, the semiconductor device 30 further includes the metal layer 27 disposed in the opening 240 (the cavity 240) defined by each of the metal pillars 315. The cavity 240 may be formed adjacent to the surface 338 of each of the metal pillars 315, and the metal layer 27 may then be formed in the cavity 240. The cavity 240 may be aligned with the corresponding opening 3131. In one embodiment, the metal layer 27 may be formed from solder, or from another metallic material softer than the metal pillar 315. If the metal layer 27 is softer than the metal pillar 315, the deformation of the metal layer 27 can release the stress caused by the CTE mismatch between the substrate 22 and the semiconductor device 30. As a result, the maximum value of the tensile stress can be reduced. In one embodiment, the barrier layer 316 may be disposed adjacent to the cavity 240.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Additionally, the drawings illustrating the embodiments of the present invention may focus on certain major characteristic features for clarity. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
a substrate; and
a semiconductor device comprising:
   a body having a center;
   a first layer disposed adjacent to the body, wherein the first layer defines a plurality of openings; and
   a plurality of conductive pillars configured to electrically connect the semiconductor device to the substrate, each of the plurality of conductive pillars extending at least partially through a corresponding one of the plurality of openings;
   wherein an offset between a first central axis of the each of the plurality of conductive pillars and a second central axis of the corresponding one of the plurality of openings varies with distance between the first central axis and the center of the body; and
   wherein the second central axis of the corresponding one of the plurality of openings is disposed between the first central axis of the each of the plurality of conductive pillars and the center of the body.

2. The semiconductor package of claim 1, wherein the offset between the first central axis of the each of the plurality of conductive pillars and the second central axis of the corresponding one of the plurality of openings increases with distance between the first central axis and the center of the body.

3. The semiconductor package of claim 1, wherein the semiconductor device further comprises a second layer disposed between the body and the first layer, the second layer being a dielectric layer having a dielectric constant less than 2.5.

4. The semiconductor package of claim 3, wherein the offset between the first central axis of the each of the plurality of conductive pillars and the second central axis of the corresponding one of the plurality of openings is configured to reduce a maximum stress on the second layer to protect the second layer from at least one of cracking and delamination.

5. The semiconductor package of claim 1, wherein:
the plurality of openings include a first opening and a second opening;
the plurality of conductive pillars include a first conductive pillar corresponding to the first opening and a second conductive pillar corresponding to the second opening;
a first offset is a first distance between a central axis of the first conductive pillar and a central axis of the first opening;
a second offset is a second distance between a central axis of the second conductive pillar and a central axis of the second opening;
a third distance between the first conductive pillar and the center of the body is greater than a fourth distance between the second conductive pillar and the center of the body; and
the first offset is greater than the second offset.

6. The semiconductor package of claim 1, wherein:
an opening included in the plurality of openings has a first diameter;

a conductive pillar included in the plurality of conductive pillars and corresponding to the opening has a second diameter; and the second diameter is at least twice as large as the first diameter.

7. The semiconductor package of claim 1, wherein:

a conductive pillar included in the plurality of conductive pillars defines a cavity; and a metallic material softer than a material forming the conductive pillar is disposed in the cavity.

8. A semiconductor package, comprising:

a substrate; and a semiconductor device comprising:

a body having a center;

a pad disposed adjacent to the body;

a first layer disposed adjacent to the body, wherein the first layer defines an opening having a first diameter and exposing the pad; and a conductive pillar electrically connected to the pad and extending at least partially into the opening, wherein the conductive pillar has a second diameter, and the second diameter is at least twice as large as the first diameter;

wherein a central axis of the conductive pillar is offset with respect to a central axis of the opening based on a distance between the central axis of the opening and the center of the body.

9. The semiconductor package of claim 8, wherein:

the central axis of the opening is disposed between the central axis of the conductive pillar and the center of the body.

10. The semiconductor package of claim 8, wherein:

the semiconductor package has a lateral surface proximate to the central axis of the conductive pillar; and the central axis of the conductive pillar is disposed between the central axis of the opening and the lateral surface.

11. The semiconductor package of claim 8, wherein the semiconductor device further comprises a second layer disposed between the body and the first layer, the second layer being a dielectric layer having a dielectric constant less than 2.0.

12. The semiconductor package of claim 8, wherein:

the conductive pillar defines a cavity; and a first material softer than a second material forming the conductive pillar is disposed in the cavity.

13. The semiconductor package of claim 12, wherein the semiconductor device further comprises a barrier layer disposed adjacent to the cavity.

14. The semiconductor package of claim 12, wherein the cavity is aligned with the opening.

15. A semiconductor package, comprising:

a substrate; and a semiconductor device comprising:

a body;

a dielectric layer disposed adjacent to the body, wherein the dielectric layer is subject to stress resulting from a mismatch of coefficient of thermal expansion (CTE) between the substrate and the semiconductor device;

a passivation layer disposed adjacent to the body, wherein the passivation layer defines an opening; and means for reducing a maximum stress on the dielectric layer to protect the dielectric layer from at least one of cracking and delamination, wherein the means for reducing the maximum stress on the dielectric layer includes a conductive pillar extending at least partially into the opening, wherein a first central axis of the opening is offset from a second central axis of the conductive pillar.

16. The semiconductor package of claim 15, wherein:

the opening has a first diameter; and the conductive pillar has a second diameter, and the second diameter is at least twice as large as the first diameter.

17. The semiconductor package of claim 15, wherein the conductive pillar defines a cavity filled with a first material softer than a second material forming the conductive pillar.

18. The semiconductor package of claim 15, wherein:

the body has a center; and the first central axis of the opening is disposed between the center of the body and the second central axis of the conductive pillar.

19. The semiconductor package of claim 15, wherein:

the body has a center;

wherein the passivation layer defines a plurality of openings including the opening;

the means for reducing the maximum stress on the dielectric layer includes a plurality of conductive pillars each extending at least partially through a corresponding one of the plurality of openings, the plurality of conductive pillars including the conductive pillar;

an offset between a second central axis of the each of the plurality of conductive pillars and a first central axis of the corresponding one of the plurality of openings varies with distance between the associated first central axis and the center of the body; and the first central axis of the corresponding one of the plurality of openings is disposed between the second central axis of the each of the plurality of conductive pillars and the center of the body.

20. The semiconductor package of claim 19, wherein the offset between the second central axis of the each of the plurality of conductive pillars and the first central axis of the corresponding one of the plurality of openings increases with increasing distance between the associated first central axis and the center of the body.

* * * * *